United States Patent [19]
Wu

[11] 3,969,670
[45] July 13, 1976

[54] ELECTRON BEAM TESTING OF INTEGRATED CIRCUITS

[75] Inventor: Leon Li-Heng Wu, Hopewell Junction, N.Y.

[73] Assignee: International Business Machines Corporation, Armonk, N.Y.

[22] Filed: June 30, 1975

[21] Appl. No.: 591,991

[52] U.S. Cl. ............................. 324/73 PC; 29/574; 324/73 AT; 250/398
[51] Int. Cl.² ........................................ G01R 15/12
[58] Field of Search ........... 29/574; 324/51, 73 AT, 324/73 PC, 158 T; 250/398; 307/303

[56] References Cited
UNITED STATES PATENTS

| | | | |
|---|---|---|---|
| 3,351,716 | 9/1970 | Tarui et al. | 324/51 |
| 3,764,898 | 10/1973 | Bohlen et al. | 324/51 |
| 3,787,720 | 1/1974 | Kiewit | 317/235 R |
| 3,796,947 | 3/1974 | Harrod et al. | 324/51 |
| 3,810,301 | 5/1974 | Cook | 29/593 |
| 3,861,023 | 1/1975 | Bennett | 29/574 |
| 3,879,613 | 4/1975 | Scott et al. | 250/492 |

*Primary Examiner*—R. V. Rolinec
*Assistant Examiner*—Vincent J. Sunderdick
*Attorney, Agent, or Firm*—Theodore E. Galanthay

[57] ABSTRACT

Disclosed is a technique for testing functional circuit units of an integrated circuit. For each separate functional circuit unit desired to be tested, a capacitor is connected to each input while a diode is connected to each output. An electron beam then selectively renders first the selected capacitors conductive, permitting the application of a desired input pattern, and then the selected diode is rendered conductive in the reverse direction, permitting sensing.

7 Claims, 5 Drawing Figures

ELECTRON BEAM TESTING OF INTEGRATED CIRCUITS

BACKGROUND OF THE INVENTION

1. Field of the Invention

This invention relates to the testing of integrated circuits and more particularly to the testing of a large scale integrated circuits by applying an electron beam to selected additional components within the circuit.

2. Description of the Prior Art

The prior art has developed a number of techniques for positioning an electron beam with an extreme degree of accuracy. This permits electron beams to be used for fabricating semiconductor circuits. For example, an electron beam can be used to selectively expose photoresist on a mask, the mask then being useful for exposing photoresist on the surface of a semiconductor. In more sophisticated systems, the electron beam is actually used to "write" a pattern on the photoresist coated surface of a semiconductor structure. The semiconductor structure then undergoes conventional processing techniques to provide useful integrated semiconductor circuits.

The ability to accurately position an electron beam makes the fabrication of large numbers of diverse custom circuits possible. This advantage accrues from the fact that the positioning of the electron beam can be controlled by a computer program which is much more readily alterable than fixed hardware masks for the fabrication of semiconductor devices. This ability to accurately position an electron beam also permits the detection of registration marks on the semiconductor surface for purposes of positioning the beam. For example, a plurality of registration "bars" may be scanned by an electron beam and the reflected electrons may be sensed by photodetectors to accurately determine the position of the beam with respect to the registration marks.

In view of the foregoing, it was inevitable that accurately positionable electron beams would also be advantageously utilized for test purposes. For example, in U.S. Pat. No. 3,763,425 issued Oct. 2, 1973, there is disclosed a non-contact method of testing for the electrical continuity of a conductor line by means of an electron beam. U.S. Pat. No. 3,764,898 issued Oct. 9, 1973, as well as the publications cited therein, teaches a similar technique. In the latter patent, at least one end of a conductor line is bombarded with a beam of electrons. A collector is positioned in spaced proximate relation to this end of the line to control the raising of the potential at this end to a particular level due to secondary emission. Current flows through the line which is measured to indicate the state of continuity in the line.

It is noted that the known prior art techniques for testing with an E-beam operate on the principle of emission of secondary electrons. These prior art techniques do not lend themselves to the actual testing of functional circuits within an integrated circuit. Thus, although the increase of circuit density on a semiconductor chip is highly desirable because it will not only lower the cost and increase the speed but also improve the reliability of the circuit, low yield levels become a stumbling block. In accordance with presently known semiconductor processing technology, the processing of a semiconductor chip reaches a level such that as the density of the circuit further increases, the yield of such a chip will drop catastrophically. The chip yield is related to the defect density such as photolithographic defects, processing defects, and silicon crystal inherent defects. One approach to lower the cost of the chip is to improve the yield by lowering the defect density. Another approach to lower the cost is to expand the working chip yield by providing redundant circuits within a semiconductor chip. The advantages of the latter scheme, however, can only be realized with an effective nondestructive test at a relatively early stage of manufacture.

SUMMARY OF THE INVENTION

Accordingly, it is primary object of this invention to test functional circuits within a large scale integrated circuit prior to the interconnection of these functional circuits with each other.

It is another object of this invention to non-destructively test electronic circuits at a relatively early stage of manufacture.

It is still another object of this invention to improve semiconductor chip yield.

In accordance with the present invention, additional circuit devices are formed into a monolithic substrate at the inputs and outputs of functional circuit units, such as a NAND logic gate, for example. The sole purpose of adding these additional components is for the early testability of the functional unit. Thus, a capacitor is placed at each of the inputs of the functional circuit unit while a diode is placed at the output.

The bombarding of selected capacitors at the input node(s) by an electron beam generates electron-hole pairs thereby temporarily freeing electrons. The conductance of these capacitances may include some resistance which, however, does not interfere with the test. The other side of these capacitors is then connected to a metallic conductor which leads to an externally probeable terminal pad. Thus, a desired input pattern may be applied directly to the functional unit selected by the electron beam.

In the manner just described for the capacitor, a diode is connected between the output node(s) and a metallic conductor leading to an output terminal pad. The bombarding of the diode junction with an electron beam also produces electron-hole pairs replenishing the depleted carriers in the depletion region normally found in a reverse biased diode. This permits the diodes to conduct (even if resistively) in the reverse direction, permitting the output of the functional unit to be detected. In this manner, circuits are tested and defective functional units are identified prior to the application of personalization metal. This permits the interconnection of only the various good functional units for use in the end product, thereby improving semiconductor chip yield.

The testing technique described herein is a combination of mechanical probe and electron beam testing. Mechanical probes are used to connect power, ground and sence control lines to the circuits in the wafer. In principle, all the circuits in a wafer can be tested with only three probes.

The foregoing and other objects, features, and advantages of this invention will be apparent from the following more detailed description of various embodiments of the invention as illustrated in the accompanying drawings.

DETAILED DESCRIPTION

Figure 1:
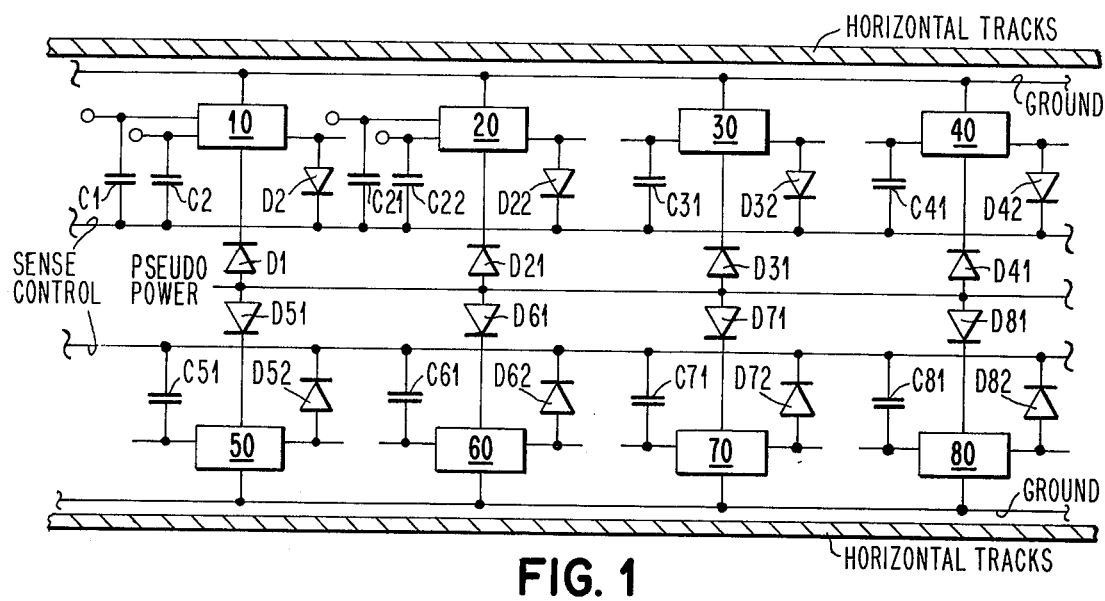
FIG. 1 is a schematic circuit diagram of a plurality of functional units adapted to be tested by the technique of the present invention.

Refer now to FIG. 1 which is a schematic diagram of a possible large scale integration configuration. A plurality of functional circuits 10, 20, 30, 40, 50, 60, 70, and 80 can be arranged in position between two parallel conductors labeled horizontal tracks. These horizontal tracks may be deposited subsequent to the herein test, and are shown for purposes of illustrating the present invention. Similarly, vertical tracks (not shown) may also subsequently be deposited as vertical buss bars. Each of the functional circuits 10, etc. may have one or more inputs and one or more outputs connecting that functional unit with other functional units on the semiconductor chip or wafer. Usually only a few functional units receive an input from off the chip or wafer (referred to as primary inputs) or provide an output off the chip or wafer (referred to as primary outputs). The process of interconnecting these functional units with each other with deposited conductor lines is referred to as personalization. The present invention provides for the testing of these circuits prior to personilization. However, at the point in time when the present test takes place, each functional circuit unit (also referred to as building block) has defined input and output nodes and is internally fully wired.

With continued reference to FIG. 1, building block 10 has a pair of inputs and a signal output as yet not wired to any other building block. Building block 10 also has a connection to ground potential, a sense control line, and a pseudo power line. The pseudo power line as well as diodes D1 and D2, as well as capacitors C1 and C2 are normally not present. These latter elements are added for the purposes of the present invention. Similarly, building block 20 has connected thereto diodes D21 and D22 as well as capacitors C21 and C22. Similarly, building block 30 has connected thereto diodes D31 and D32 and capacitor C31. Note that building block 30 has only one input and one output shown for purposes of simplifying the illustration. Similarly, each of the remaining building blocks 40, 50, 60, 70, and 80 are connected with a capacitor and a pair of diodes as shown in FIG. 1 and have been included merely to show the arrangement of a plurality of building blocks.

Figure 2:
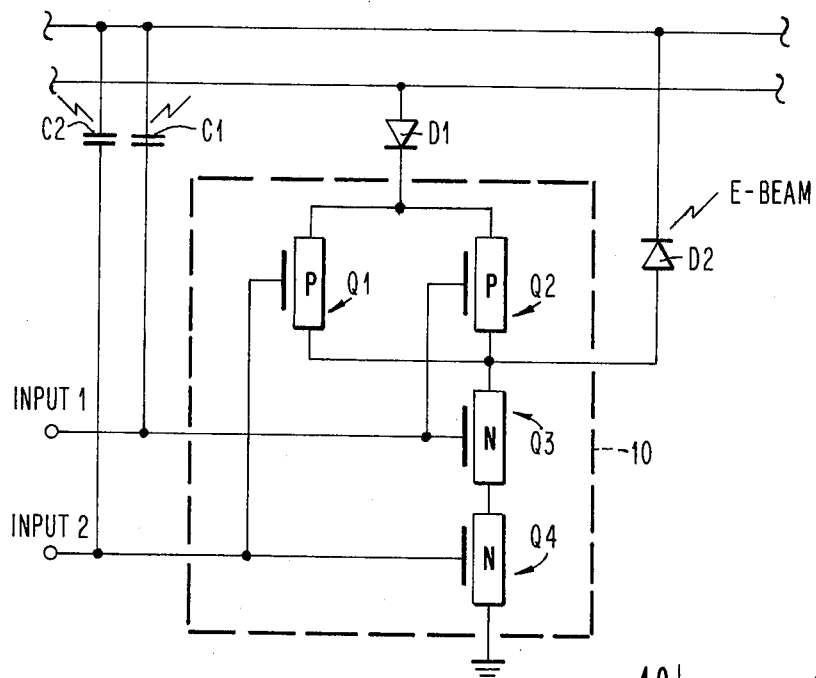
FIG. 2 is a schematic circuit diagram of a single functional unit for testing by the techniques of the present invention.

As illustrated in FIG. 2, functional circuit 10 is shown in greater detail by way of example. As illustrated, functional circuit 10 is a two input NAND gate which has the characteristic that if both inputs are at a logical up level, then the output is at a down level, whereas it either input is at a down level, the output will be at a logical up level. Also, in this specific example, the circuit is implemented in complementary MOS (CMOS) technology. Thus, p channel transistors Q1 and Q2 are connected in electrical parallel with their drain electrodes connected to diode D1 and their source electrodes, forming the output of the circuit, connected to D2. As is well known, in semiconductor fabrication, source and drain electrodes are structurally similar and therefore arbitrarily interchangeable. N channel field effect transistors Q3 and Q4 are connected in electrical series with the drain of Q3 being connected to the output connection to diode D2, the source of Q3 and the drain of Q4 being connected together, the source of Q4 being connected to ground potential. The first input to the circuit for an input one is connected to the gate of Q1 and Q4 while the second input (two) is connected to the gate of Q2 and Q3. The sense control line is coupled to input one by capacitor C1 and to input two by a capacitor C2 while it is coupled to the output connection by diode D2. The pseudo power line is coupled to the drain electrodes of Q1 and Q2 by diode D1.

The illustrated pseudo power line is a metal line from the test pad to the functional circuits under test and is used to supply power to the circuit block through the forward biased diode D1. After the test, this line is electrically grounded and not used further in the end product. By grounding the pseudo power line, it is assured that it will not apply a potential across any circuit.

The sense control line also is a metal line which is used both to address the input and also sense the output of the circuit block. It is through this line that a signal is applied to the capacitors C1 and C2, and selectively to the input terminals of the functional circuit. After an input pattern has been inputted, the same sense control line is used to detect the output state of the functional circuit. After the test, the sense control line is connected to the drain electrodes of Q1 and Q2 forming the supply power line to the functional circuit in the end product.

Figure 4:
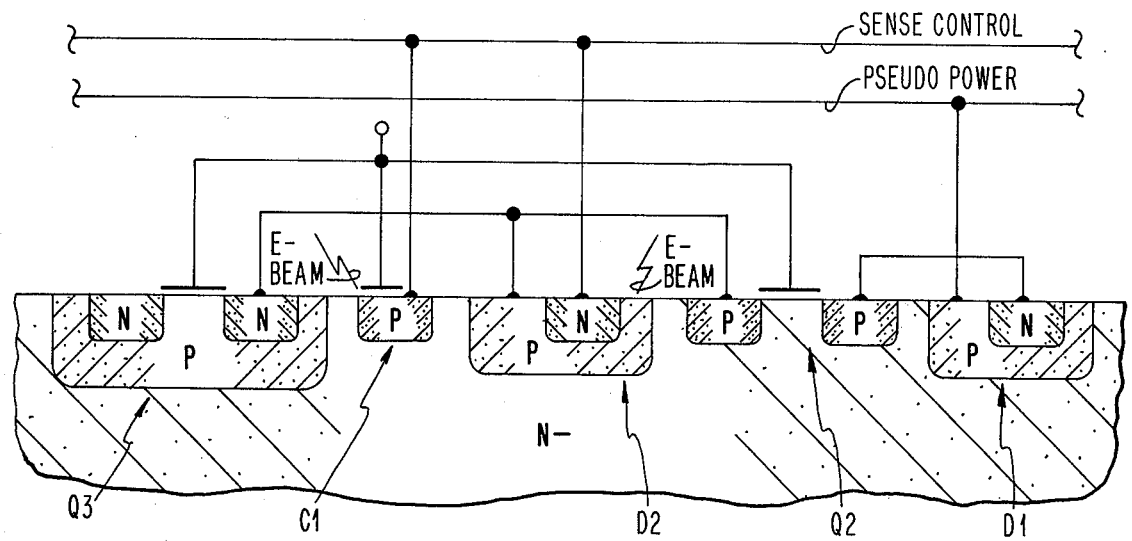
FIG. 4 is an integrated circuit structure of a circuit under test.

Refer now to FIG. 4 for a fragmentary cross section of a portion of the circuit diagram of FIG. 2 fabricated in accordance with known semiconductor technology. Illustrated are transistors Q2 and Q3, diodes D1 and D2, and capacitor C1. Effectively, input 2 and the elements associated therewith have been omitted from the FIG. 4 drawing to simplify the explanation of the invention. Nevertheless, the FIG. 4 illustration is a complete invert circuit as shown.

A semiconductor substrate lightly doped with an n type impurity forms a support for the circuit illustrated in FIG. 4. Proceeding from left to right, field effect transistor Q3 is formed by first doping with a p type impurity. This can be accomplished by selected diffusion, ion implantation or any other known technique of impregnating a semiconductor material with an impurity. Two n type pockets are then formed in the p region and a thin oxide layer (not shown specifically) separate the conductive gate region from the semiconductor surface. The gate material is typically metal or very highly conductive doped polycrystalline silicon. This gate region forms part of the input terminal into connection. Capacitor C1 is formed with a p type impurity pocket and a gate region separated by a relatively thick oxide dielectric in the order of 5,000A Diode D2 is formed with an n type pocket in a p type pocket forming the pn junction. P channel transistor Q2 is formed with a pair of p type pockets and a gate region. Diode D1 is formed with an n type pocket in a p type pocket. The conductive connections illustrated correspond to the interconnections of FIG. 2.

Figure 5:
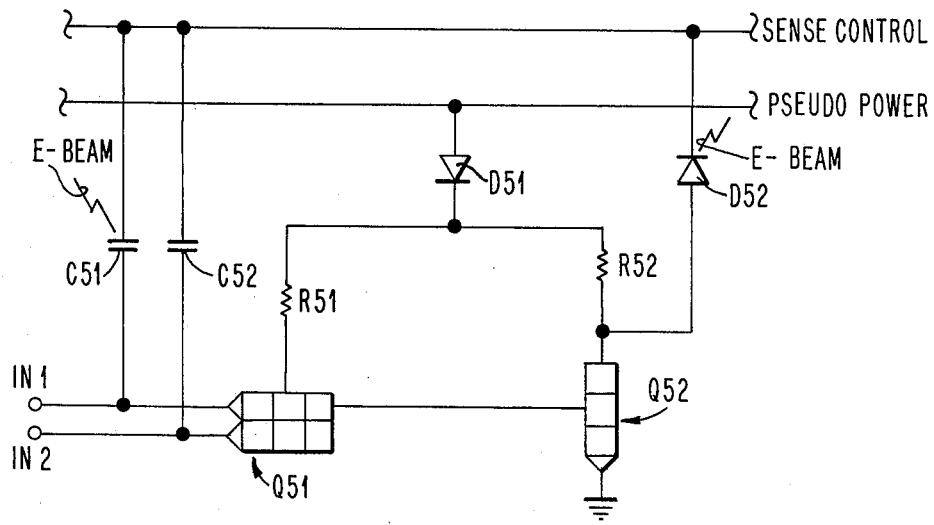
FIG. 5 is an alternate type of functional unit under test by the electron beam technique of the present invention.

Refer now to FIG. 5 which illustrates the testing for a different type of functional circuit. The functional circuit again has two inputs and one output and comprises transistors Q51 and Q52 and resistors R51 and R52 interconnected as shown. Capacitors C51 and C52 form the input devices while diode D52 forms the output device. Diode D51 is the unilaterally conducting means for supplying pseudo power to the circuit while it is under test.

TEST OPERATION

After the circuits are organized as described, the semiconductor wafer is ready for testing. The testing is divided into two stages. The first stage is to set the input conditions while the second stage is to sense the output.

As shown in FIG. 2, a two fan-in CMOS NAND gate is assumed as the functional circuit to be tested. The pseudo power line is brought to a logic up level supplying power to the functional circuit through the forward biased diode D1. The desired input pattern is applied to the functional circuit by a combination of the logic level on the sense control line and the conductivity of the capacitors C1 and C2.

In order to render one of the capacitors conductive, an electron beam is focused thereon. As illustrated in FIG. 4, the electron beam is aimed at the oxide dielectric layer to generate electron hole pairs rendering the oxide layer a rather good conductor. For example, when directing an electron beam with 25 kev energy and a beam current of 0.15 microamps (uA) a current of 1.5 uA will pass between a metal oxide (5,000A) to diffusion capacitance with an application of several volts.

Figure 3:
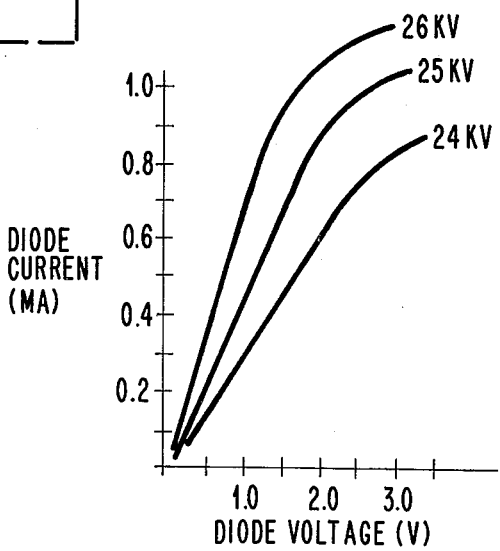
FIG. 3 is a waveform diagram illustrating the effects of various intensities of electron beam.

Assuming an input capacitance of 0.3 pf it will take one microsecond to charge it up to 5 volts. It is recognized that the logic circuit of FIG. 2 can receive up to four binary input patterns. When it is desired to bring an input to an up level, the pseudo power line is brought to an up logic level and the corresponding capacitor is irradiated with an electron beam. Thus, by a combination of selectively irradiating capacitor C1 and/or C2 and bringing the sense control line to an up or down logic level, all four binary combinations can be applied. After the desired input pattern has been applied, the step of sensing the output is commenced. First, the sense control line is raised to an up logic level. Next, the electron beam is focused on the reverse biased diode D2 which connects between the output node of the circuit and the sense control line. If the voltage of the output node is at a down logic level, current will flow into the circuit. If the output node is also at an up logic level, no current will flow. The amplitude of the current flowing through the diode is a function of: voltage difference, beam current, and beam energy. FIG. 3 illustrates a range of such current and voltage values for the electron beam (E-beam) with energy levels of 24kv, 25kv, or 26kv, for a beam current of 0.15uA. Assuming a 25kv beam with a reverse biased diode voltage across diode D2 of approximately 2.5 volts, almost one milliamp (ma) of diode current flows. This is certainly a readily detectable current flow to determine that the output node is at a down logic level.

It is here further noted that since the capacitance (input device) is a thick oxide (5,000A) capacitance, and the input gate of capacitance of the field effect transistors is a thin oxide capacitance (500A), the raising of the sense control line (assuming it was at a down logic level) does not disturb the preset input condition. Of course the capacitors C1 and C2 must no longer conduct resistively but be capacitors again in order not to disturb the input condition. Of course in the case where the sense control line was already at an up level for setting the desired input condition, there is no change in the logic level of the sense control line for performing the sense operation, and the foregoing potential concerns do not arise.

As a third step in the present invention, defective circuits are identified and isolated. To prevent a loss of power from the detected defective circuits, the pseudo power line is eliminated from affecting the operation of the circuit by grounding. The sense control line, then, is connected as the power line to the functional circuit. All power lines of the functional circuit are then connected to the sense control line during the customized wiring process. If a laser beam or ion etching can be used to disconnect the defective circuit block, then the diode D1 can be eliminated and both the pseudo power lines and the sense control lines can be used at the power line for the circuit end product. The selection of the desired circuit block is then accomplished by disconnecting the defective circuit block from the power line.

What has then been described is an improved testing technique utilizing an accurately positionable electron beam. In a large scale integrated circuit, additional input devices (such as capacitors) and additional output devices (such as diodes) are connected at the input and output of each functional circuit, and these additional devices have their conductivity temporarily affected by the application of an electron beam which causes a generation of electron hole pairs. In the case of the capacitor, the dielectric is rendered conductive by temporarily freeing electrons in the dielectric region. In the case of the diode, electron beam replenishes depleted carriers in the depletion region by generating electron hole pairs. The test is completely nondestructive since the test input and output devices return to their original characteristics after the electron beam is no longer applied. It is also to be noted that the electron beam is never aimed at an actual device that forms part of the functional circuit end product.

While the invention has been shown and particularly described with reference to preferred embodiments, it will be understood by those skilled in the art that various changes in form and detail may be made therein without departing from the spirit and scope of the invention.

What is claimed is:

1. In an integrated circuit structure including a plurality of functional circuits, each having at least one input and at least one output, the method of testing each said circuits comprising the steps of:
    connecting one side of each one of a plurality of capacitive means to an input of each said circuit;
    connecting the other side of said plurality of capacitive means to a desired logic potential level; and
    selectively applying an electron beam to desired ones of said capacitive means, thereby generating electron-hole pairs rendering said capacitive means resistively conductive.

2. A method of testing as in claim 1 further comprising the steps of:

selectively applying an electron beam to desired ones of a plurality of unilaterally conducting means, one each connected to an output of each said circuits, thereby generating electron-hole pairs rendering said unilaterally conducting means bilaterally conductive; and connecting another side of said unilaterally conducting means to desired logic potential level and determining the current flow in the reverse direction through said unilaterally conducting means.

3. The method of testing as in claim 2 further comprising the step of:

selecting good ones of said plurality of functional circuits and interconnecting said good functional circuit units while bypassing defective functional circuit units.

4. A large scale integrated circuit structure having a plurality of functional circuit units, each having at least one input and one output, the improvement comprising:

a test capacitor input device adapted for the application of an electron beam, connected to an input of at least one of said plurality of functional circuit units; and a reverse biased unidirectionally conducting means also adapted for the application of an electron beam, connected to an output of at least the same one of said plurality of functional circuit units.

5. A large scale integrated circuit structure as in claim 4 further comprising:

a forward biased unidirectionally conducting means connecting a source of power to each said functional circuit unit.

6. A large scale integrated circuit structure as in claim 5 wherein each said unidirectionally conducting means comprises a diode.

7. A large scale integrated circuit structure as in claim 4 further comprising:

a conductive line for supplying an input signal to said capacitor input device connected to each said capacitor input; and said same conductive line being connected to said reverse biased unidirectionally conducting means for sensing an output signal from said functional circuit unit.

* * * * *